United States Patent
Cheng et al.

(10) Patent No.: US 10,036,948 B2
(45) Date of Patent: Jul. 31, 2018

(54) ENVIRONMENTAL-SURROUNDING-AWARE OPC

(71) Applicant: Taiwan Semiconductor Manufacturing Company, Ltd., Hsinchu (TW)

(72) Inventors: Wen-Li Cheng, Taipei (TW); Ming-Hui Chih, Luzhou (TW); Ru-Gun Liu, Zhubei (TW); Wen-Chun Huang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/602,485

(22) Filed: May 23, 2017

(65) Prior Publication Data

US 2017/0262571 A1 Sep. 14, 2017

Related U.S. Application Data

(63) Continuation of application No. 14/831,926, filed on Aug. 21, 2015, now Pat. No. 9,679,100.

(51) Int. Cl.
  *G03F 1/36* (2012.01)
  *G03F 1/72* (2012.01)
  *G03F 1/70* (2012.01)

(52) U.S. Cl.
  CPC ........... *G03F 1/36* (2013.01); *G03F 1/70* (2013.01); *G03F 1/72* (2013.01)

(58) Field of Classification Search
  CPC .......... G06F 17/5081; G03F 1/36; G03F 1/70; G03F 1/72
  See application file for complete search history.

(56) References Cited

U.S. PATENT DOCUMENTS

| | | | |
|---|---|---|---|
| 6,430,737 B1 * | 8/2002 | Cobb | G03F 1/36 716/52 |
| 6,721,938 B2 * | 4/2004 | Pierrat | G03F 1/30 430/394 |
| 6,777,138 B2 | 8/2004 | Pierrat et al. | |
| 6,928,634 B2 * | 8/2005 | Granik | G03F 7/70433 716/52 |

(Continued)

FOREIGN PATENT DOCUMENTS

| | | |
|---|---|---|
| KR | 10-2009-0064993 A | 6/2009 |
| TW | 200951672 A | 12/2009 |
| TW | 201407264 A | 2/2014 |

OTHER PUBLICATIONS

Office Action for German Application No. 10 2015 114 918.4, dated Apr. 12, 2016, 6 pgs.

(Continued)

*Primary Examiner* — Naum B Levin
(74) *Attorney, Agent, or Firm* — Haynes and Boone, LLP

(57) ABSTRACT

The present disclosure provides a method of performing optical proximity correction (OPC). An integrated circuit (IC) design layout is received. The design layout contains a plurality of IC layout patterns. Two or more of the plurality of IC layout patterns are grouped together. The grouped IC layout patterns are dissected, or target points are set for the grouped IC layout patterns. Thereafter, an OPC process is performed based on the grouped IC layout patterns.

20 Claims, 9 Drawing Sheets

(56) References Cited

U.S. PATENT DOCUMENTS

| | | | |
|---|---|---|---|
| 7,080,349 B1* | 7/2006 | Babcock | G03F 1/36 716/136 |
| 7,260,812 B2* | 8/2007 | Melvin, III | G03F 1/36 430/5 |
| 7,451,068 B2 | 11/2008 | Melvin, III | |
| 7,691,543 B2* | 4/2010 | Yasuzato | G03F 1/36 430/5 |
| 7,739,650 B2 | 6/2010 | Torres Robles et al. | |
| 7,784,019 B1 | 8/2010 | Zach | |
| 7,926,002 B2 | 4/2011 | Word et al. | |
| 8,045,785 B2* | 10/2011 | Kitamura | G06K 9/00 348/125 |
| 8,056,022 B2 | 11/2011 | Robles et al. | |
| 8,111,901 B2 | 2/2012 | Nikolsky | |
| 8,187,974 B2* | 5/2012 | Park | G03F 1/144 216/37 |
| 8,365,108 B2 | 1/2013 | Baum et al. | |
| 8,381,153 B2 | 2/2013 | Chiang et al. | |
| 8,484,585 B2* | 7/2013 | Han | G03F 1/36 716/53 |
| 8,527,916 B1 | 9/2013 | Chiang et al. | |
| 8,572,520 B2 | 10/2013 | Chou et al. | |
| 8,572,521 B2 | 10/2013 | Chen et al. | |
| 8,589,828 B2 | 11/2013 | Lee et al. | |
| 8,589,830 B2 | 11/2013 | Chang et al. | |
| 8,601,419 B1* | 12/2013 | Chiang | G06F 17/5081 716/112 |
| 8,612,902 B1* | 12/2013 | Agarwal | G03F 7/70433 716/54 |
| 8,627,241 B2 | 1/2014 | Wang et al. | |
| 8,631,360 B2 | 1/2014 | Wang et al. | |
| 8,631,361 B2 | 1/2014 | Feng | |
| 8,701,052 B1 | 4/2014 | Kuo et al. | |
| 8,713,483 B2 | 4/2014 | Tritchkov et al. | |
| 8,732,626 B2 | 5/2014 | Liu et al. | |
| 8,739,080 B1 | 5/2014 | Tsai et al. | |
| 8,745,550 B2 | 6/2014 | Cheng et al. | |
| 8,751,976 B2 | 6/2014 | Tsai et al. | |
| 8,762,900 B2 | 6/2014 | Shin et al. | |
| 8,812,999 B2 | 8/2014 | Liu et al. | |
| 8,850,366 B2 | 9/2014 | Liu et al. | |
| 8,869,075 B2 | 10/2014 | Sun et al. | |
| 8,948,495 B2 | 2/2015 | Marcuccilli et al. | |
| 9,064,078 B2* | 6/2015 | Verma | G06F 17/5072 |
| 9,086,634 B2* | 7/2015 | Kono | G03F 1/68 |
| 9,679,100 B2* | 6/2017 | Cheng | G06F 17/5081 |
| 2003/0189863 A1 | 10/2003 | Lippincott et al. | |
| 2005/0223350 A1 | 10/2005 | Zhang et al. | |
| 2005/0278686 A1 | 12/2005 | Word et al. | |
| 2006/0003135 A1 | 1/2006 | Nojirna | |
| 2012/0072874 A1 | 3/2012 | Chiang et al. | |
| 2013/0223723 A1* | 8/2013 | Shibahara | G01B 21/20 382/145 |
| 2013/0232456 A1 | 9/2013 | Kallingal et al. | |
| 2013/0267047 A1 | 10/2013 | Shih et al. | |
| 2013/0326434 A1* | 12/2013 | Feng | G03F 1/36 716/52 |
| 2014/0007024 A1 | 1/2014 | Tsai et al. | |
| 2014/0101624 A1 | 4/2014 | Wu et al. | |
| 2014/0109026 A1 | 4/2014 | Wang et al. | |
| 2014/0120459 A1 | 5/2014 | Liu et al. | |
| 2014/0282334 A1 | 9/2014 | Hu et al. | |

OTHER PUBLICATIONS

Office Action for Taiwanese Application No. 10521583360, dated Dec. 26, 2016, 6 pgs.
Office Action for Korean Application No. 10-2015-0153744, dated Jan. 31, 2017, 6 pgs.

* cited by examiner

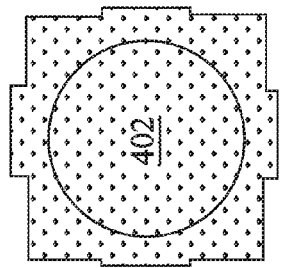
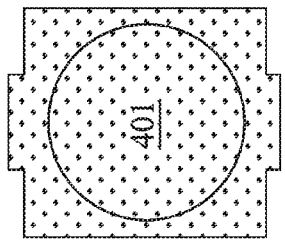
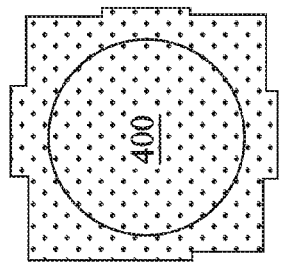
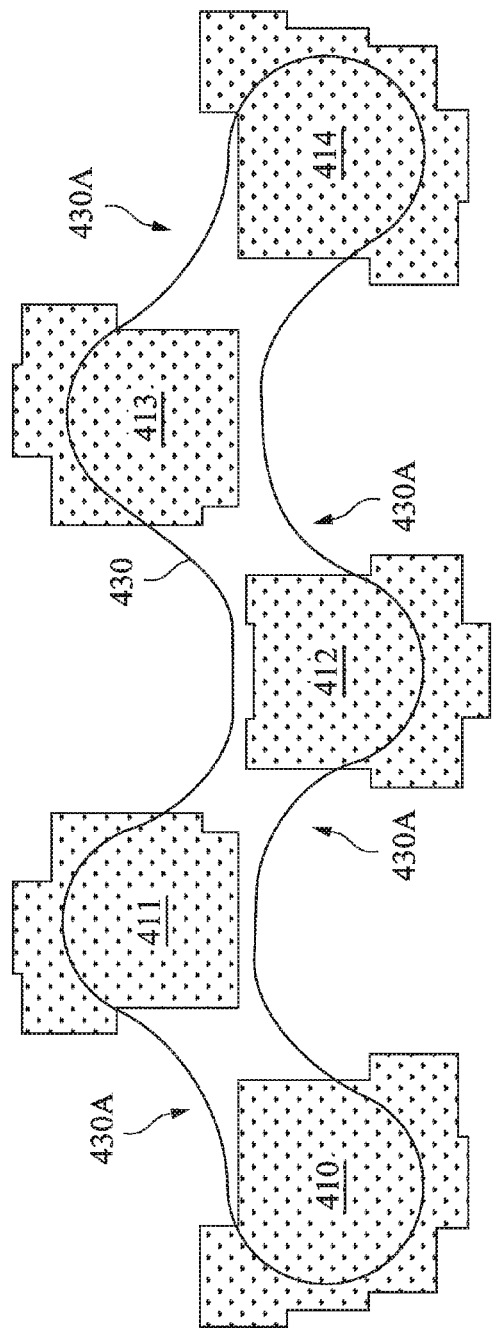
Fig. 6A
Fig. 6B

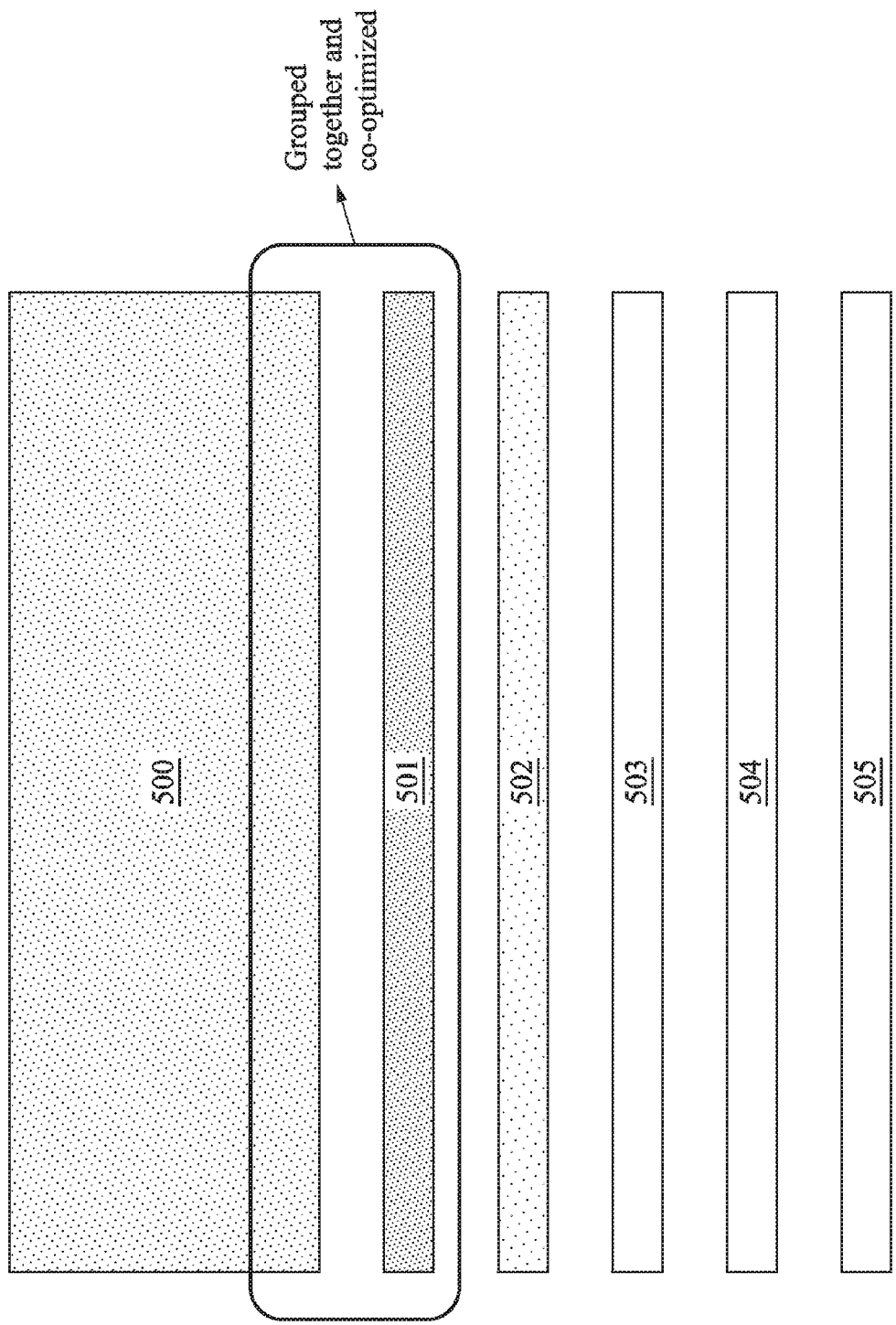

ENVIRONMENTAL-SURROUNDING-AWARE OPC

PRIORITY DATA

The present application is a continuation of U.S. patent application Ser. No. 14/831,926, filed on Aug. 21, 2015, now U.S. Pat. No. 9,679,100 the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

For these advances to be realized, similar developments in IC processing and manufacturing are needed. For example, to enhance the imaging effect when a design pattern is transferred to a wafer, optical proximity correction (OPC) is used. The design pattern is adjusted to generate an image on the wafer with improved resolution. However, conventional OPC processes do not fully take into account the surrounding environment of layout patterns. As such, conventional OPC processes fail to fully consider potential interactive effects between nearby layout patterns. This may lead to degraded performance and possibly device failures.

Therefore, while conventional OPC processes have been generally adequate for their intended purposes, they have not been entirely satisfactory in every aspect. What is needed is an OPC process that takes into account the interaction between neighboring layout patterns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A-5B, 6A-6B, and 7 are diagrammatic top views of various example IC layout patterns that help illustrate the OPC processes in accordance with some embodiments of the present disclosure.

DETAILED DESCRIPTION

Figure 1:
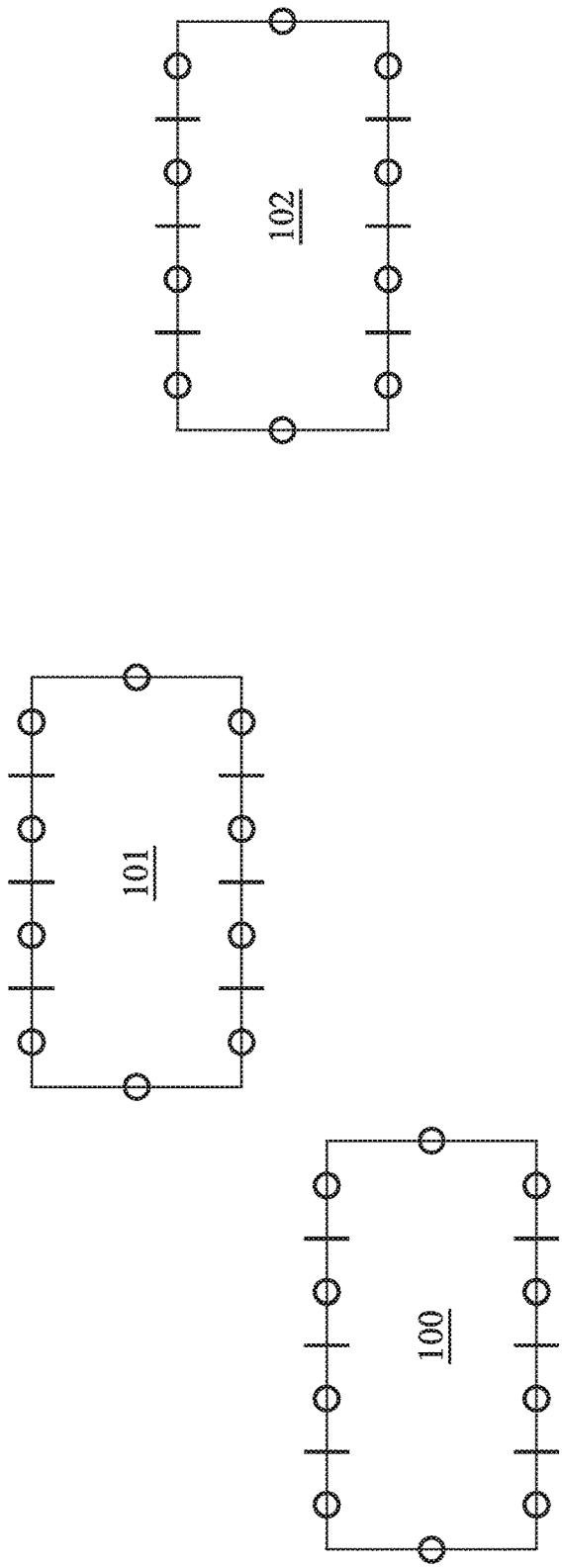

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, a foundry may receive an IC layout design file (e.g., in a Graphic Database System (GDS) format) from a design house. The IC layout design contains numerous IC layout patterns, which may include circles, rectangles, or other polygons. The foundry performs photolithography processes to transfer the images of layout patterns from a photomask to a wafer. However, due to various effects caused by diffraction or semiconductor processing, image errors may occur. As a result, the actually fabricated IC layout patterns may not sufficiently resemble their original design. To correct this problem, Optical proximity correction (OPC) has been used to compensate for these image errors. For example, OPC may move edges of the IC layout patterns or reshape the IC layout patterns (e.g., by adding additional components) on the photomask. OPC allows the actually fabricated IC layout patterns to more closely resemble their intended design.

However, in some situations, even aggressive OPC modeling may not be enough. For example, double patterning has been implemented in advanced technology nodes by using pitch splitting. A target layout may be split to multiple layers to relax the fidelity budget of scanner patterning and also to relax the rules of OPC. Yet for some special target layouts (such as for features that are really small or close to adjacent features), even triple or quadruple pitch splitting may still fail to resolve them. In other words, the pattern features may still merge together even after utilizing aggressive OPC modeling. The present disclosure aims to deal with such kind of features after certain number of pitch splittings have been performed but are still outside of the process specification.

In some OPC processes, the edges of the IC layout patterns are dissected into a plurality of segments, and target points are assigned for these segments to go through. Simulations are run to see what the fabricated IC layout pattern would look like. Based on the simulation results, the dissections and target points may be adjusted, and thereafter the simulation may be repeated again. However, conventional OPC processes may not fully take into account of the interaction between IC layout patterns that are nearby one another, for example the IC layout patterns that cannot be resolved even by double patterning techniques (including triple or quadruple pitch splitting). In other words, conventional OPC processes are not fully aware of the surrounding environment of these special types of IC layout patterns that are difficult to be resolved even when double patterning has been utilized.

This problem exacerbated as the generation of semiconductors become smaller and smaller, critical dimensions and/or pitch become smaller too, and thus the potential interaction between nearby IC layout patterns becomes more significant. Since conventional OPC processes do not fully take such interaction into account, the OPC results may not be satisfactory. For example, an actually fabricated IC layout pattern without any IC layout patterns nearby may look quite different if the same IC layout pattern is now located close to one or more other IC layout patterns. Stated differently, the environment in which an IC layout patterns is located (i.e., its surroundings) may have a significant impact on its appearance in fabrication, and this impact has not been sufficiently considered by conventional OPC processes.

To overcome these shortcomings of the conventional OPC processes, the present disclosure is directed to an OPC process that does take into account of the IC layout patterns' surroundings or environment, as discussed below with reference to FIGS. 1-4, 5A-5B, 6A-6B and 7-9.

FIG. 1 is a diagrammatic top view of a plurality of example IC layout patterns 100-102. In some embodiments, the IC layout patterns 100-102 are patterns that can be difficult to be resolved using the double patterning or pitch splitting techniques discussed above. The IC layout patterns 100-102 are shaped as rectangles herein, but it is understood that they may take on other shapes in different embodiments. As a part of an OPC process, the long edges of each of the IC layout patterns 100-102 are dissected into a plurality of segments (the short edges may be dissected in other embodiments as well). Target points are also placed along the edges of the IC layout patterns 100-102. The IC layout patterns may then run through OPC simulation. Ideally, the OPC simulation results will w that the dissected segments or edges of the IC layout patterns 100-102 will go through (or coincide with) their respective target points. The OPC simulation may be considered satisfactory if that was the case.

As illustrated in FIG. 1, the IC layout pattern 102 is sufficiently far away from the IC layout patterns 100-101, and thus the OPC of the IC layout pattern 102 is unlikely to be affected by the presence of the IC layout patterns 100-101. However, the close proximity (e.g., less than about 100 nanometers) between the IC layout patterns 100 and 101 may cause problems. For example, their close proximity may lead to optical imaging problems such that the simulated edges or dissected segments of the IC layout patterns 100-101 may miss their respective target points. This may be especially true for the top right corner of the IC layout pattern 100 and the bottom left corner of the IC layout pattern 101, since these two regions are located closest to the other IC layout pattern and are thus most likely to be affected by the other nearby IC layout pattern.

Figure 2:
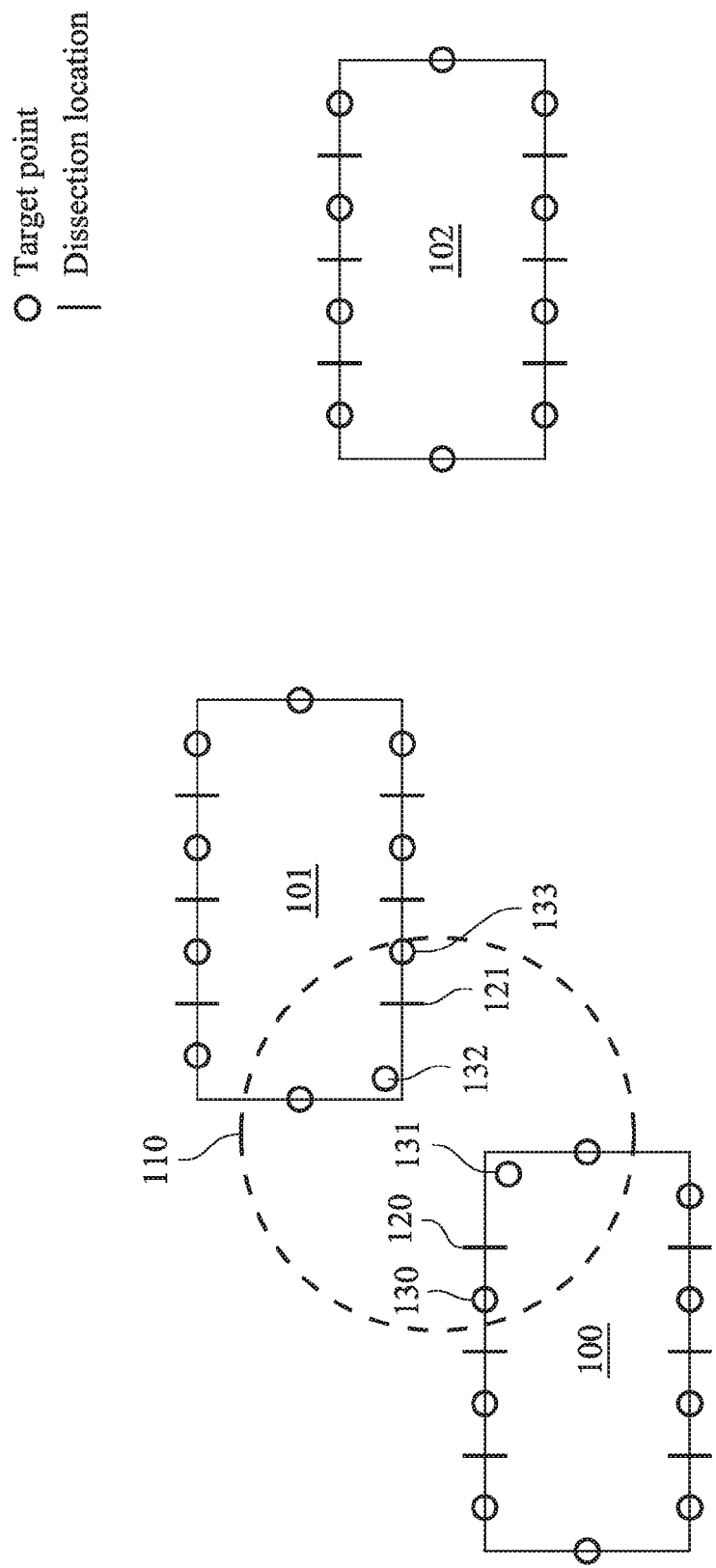

FIG. 2 illustrates the diagrammatic top view of the same IC layout patterns 100-102 shown in FIG. 1, but with their dissections and target points adjusted according to the various aspects of the present disclosure. As is shown in FIG. 2, the close proximity between the IC layout patterns 100-101 creates an area or zone of interaction 110. The dissection locations and target points within this zone 110 may be moved or adjusted to account for the influence exerted by the nearby IC layout pattern.

For example, a dissection location 120 of the IC layout pattern 100 and a dissection location 121 of the IC layout pattern 101 each fall within the zone of interaction 110. In addition, target points 130-131 of the IC layout pattern 100 and target points 132-133 of the IC layout pattern 101 also fall within the zone of interaction 110. Compared to FIG. 1, the dissection locations 120-121 and the target points 130-133 are moved closer toward the center of the zone of interaction 110. Alternatively stated, the dissection locations 120 and the target points 130-131 of the IC pattern 100 are moved closer to the IC pattern 101, and the dissection locations 121 and the target points 132-133 of the IC pattern 101 are moved closer to the IC pattern 100.

Note that whereas the dissection locations and the target points were distributed symmetrically within each of the layout patterns 100-102 in FIG. 1, that is no longer the case in FIG. 2. The adjustment to the dissection locations and target points as shown in FIG. 2 causes them to "gravitate" toward the zone of interaction 110. Thus, it may be said that the OPC process herein involves moving the dissection locations and target points asymmetrically within the affected IC layout patterns.

The adjustment of the dissection locations 120-121 and the target points 130-133 within the zone of interaction 110 helps better define the contour edges of the IC layout patterns 100-101, especially the contour edges within the zone of interaction 110. Due to the close proximity between the IC layout patterns 100 and 101, they exert a "pull" with respect to one another. Had the dissection locations and the target points not been moved as was the case shown in FIG. 1 then the IC layout pattern 100 may "pull" on the IC layout pattern 101, and the IC layout pattern 101 may "pull" on the IC layout pattern 100. When this happens, although the resulting contour edge of the IC layout patterns 100-101 may still go through the assigned target points, the contour shape is undesirably stretched, and a bridging risk (the IC layout patterns 100-101 actually physically touching each other) is greater.

To combat these problems, the IC layout patterns 100-101 are grouped together, meaning OPC dissection locations and target points of one IC layout pattern are implemented while taking into account of the other IC layout pattern nearby. Specifically, by moving the dissection locations and the target points within the zone of interaction 110, the resulting contour edges have more carefully defined locations. This compensates for the influence exerted by the nearby IC layout patterns 100-101. Consequently, bridging risks are mitigated.

Meanwhile, since the IC layout pattern 102 is located sufficiently far away from the rest of the IC layout patterns 100-101, the influences exerted between the pattern 102 and the patterns 100-101 may be too small to cause problems. Therefore, no adjustment is necessary to the dissection locations and target points of the IC layout pattern 102.

Figure 3:
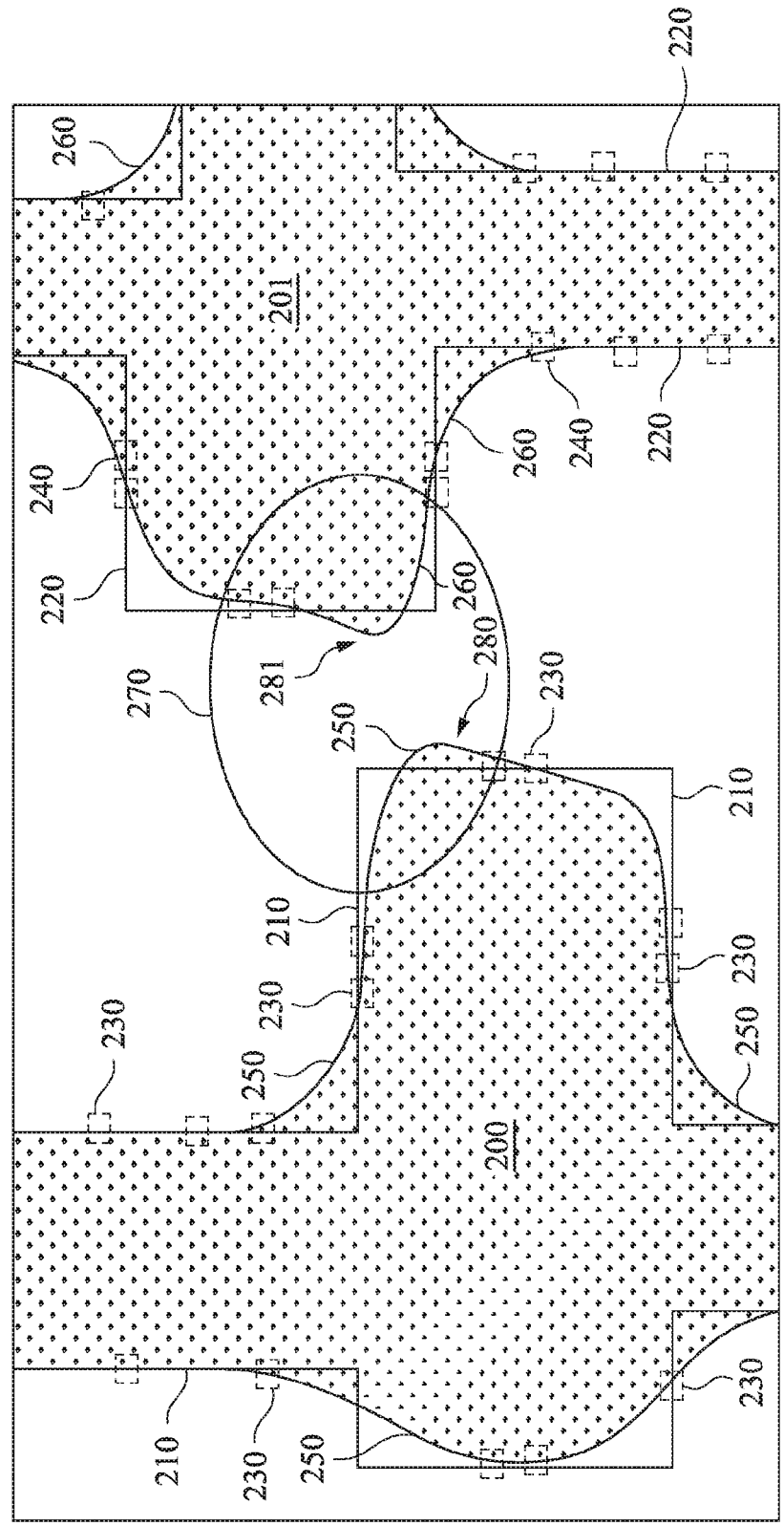
Figure 4:
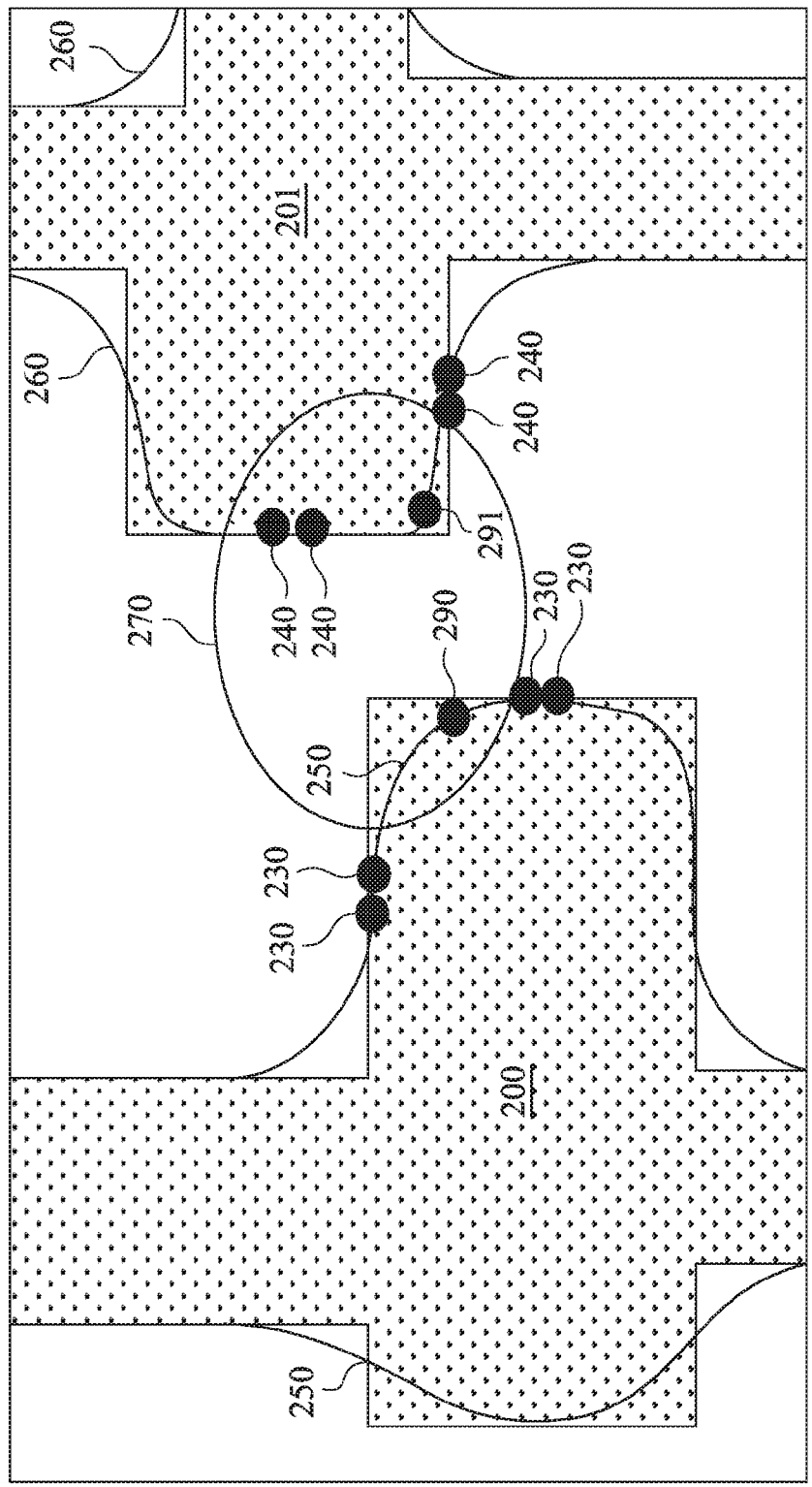

FIGS. 3-4 and the discussions below provide a further example to illustrate the OPC concepts of the present disclosure. In more detail, FIG. 3 illustrates a top view of two adjacent IC layout patterns 200 and 201 with conventional OPC, and FIG. 4 illustrates the top view of the same two IC layout patterns 200-201 with the improved OPC of the present disclosure. In some embodiments, the IC layout patterns 200-201 are patterns that can be difficult to be resolved using the double patterning or pitch splitting techniques discussed above.

Referring to FIG. 3, according to the original IC layout design (e.g., the CMS file from the design house), the IC layout pattern 200 has a plurality of straight edges 210 that form perpendicular corners with each other, and the IC layout pattern 201 has a plurality of straight edges 220 that form perpendicular corners with each other as well. Ideally, the fabricated IC patterns would retain this shape. However, this is nearly impossible in real world fabrication due to optical constraints and other process related issues. Hence, engineers at the foundry try to make the actually fabricated pattern come close to resembling the polygonal shape specified by the original design through OPC techniques.

For example, a plurality of target points 230 are placed on the edges 210 of the IC layout pattern 200, and a plurality of target points 240 are placed on the edges 220 of the IC layout pattern 201. The target points 230 and 240 may be located on their corresponding dissected segments, but the dissection locations are not specifically illustrated herein for reasons of simplicity. Note that not all target points are explicitly labeled with reference numerals in FIG. 3 for reasons of simplicity.

OPC simulations are performed to generate the predicted contours 250 and 260 of the IC layout patterns 200 and 201, respectively. As is shown in FIG. 3, the contours 250 and 260 have curvature and do not correspond exactly with the polygonal shape (represented by the straight edges 210 and 220) specified by the original design. For most areas though, the contours 250 and 260 conform well enough with the original polygonal design so that they do not present problems.

However, the close proximity of the IC layout patterns 200 and 201 creates a zone of interaction 270. Even though the simulated contours 250 and 260 pass all the specified target points, a portion 280 of the contour 250 within the zone 270 is still "pulled" toward the IC layout pattern 201, and a portion 281 of the contour 260 within the zone is pulled "pulled" toward the IC layout pattern 200. Due to the "pulled out" portions 280-281 of the contours 250 and 260, respectively, there is now a higher likelihood of bridging between the IC layout patterns 200-201, which creates an undesirable electrical short connection. In other words, even though the OPC simulation will officially pass the test, a real world problem still exists, because the OPC simulation in FIG. 3 is performed without taking the surrounding environment of the IC layout patterns 200 or 201 into account.

FIG. 4 illustrates how the OPC processes of the present disclosure overcome the issues shown in FIG. 3 discussed above. Since the zone of interaction 270 is a sensitive region, auxiliary target points 290 and 291 are added to the IC layout patterns 200 and 201, respectively, to better define the shape and/or location of the contours 250 and 260. This is because the OPC simulations are performed to make sure that the contour 250 will have to go through the auxiliary target point 290, and that the contour 260 will have to go through the auxiliary target point 291.

As auxiliary target points 290 and 291 are placed at desired locations (e.g., near the corners) within the IC layout patterns 200 and 201, the contours 250 and 260 now exhibit nice rounded curves near the corner regions of the IC layout patterns 200 and 201, rather than being "pulled out" toward each other as shown in FIG. 3. In this manner, the auxiliary target points 290 and 291 effectively help lock down at least a portion of the contour location, which in turn mitigates the "out of control" contour behavior seen in FIG. 3 that is caused by the close proximity between the IC patterns 200-201. Accordingly, bridging risks are reduced.

It is understood that conventional OPC rules do not allow any individual features to be merged together (e.g., bridging). However, the present disclosure is not constrained by this limitation. In other words, the present disclosure allows some features to bridge each other when a group of adjacent features meet the requirement/criteria to be grouped and asserted target points. The bridging of the patterns/features could actually be observed during an After Development Inspection (ADI), but following with other subsequent processes, the final contour would not have any pattern bridging issues.

It is also understood that although the embodiment shown in FIG. 4 utilizes additional auxiliary target points to help define the contour shape, the same may be accomplished by adjusting the original target points and the dissection locations as discussed above with reference to FIG. 3, without having to add additional target points. For example, some of the target points 230 may be moved closer to the corner regions of the IC design pattern 200 (e.g., closer to where the auxiliary target point 290 would have been placed), and some of the target points 240 may be moved closer to the corner regions of the IC design pattern 201 (e.g., closer to where the auxiliary target point 291 would have been placed), and the dissection locations may be adjusted accordingly as well. Doing so may accomplish the same goal as adding the auxiliary target points 290-291, that is, generating better contours 250 and 260 that more closely resemble the polygons e the original designs for the patterns 200-201).

Figure 5B:
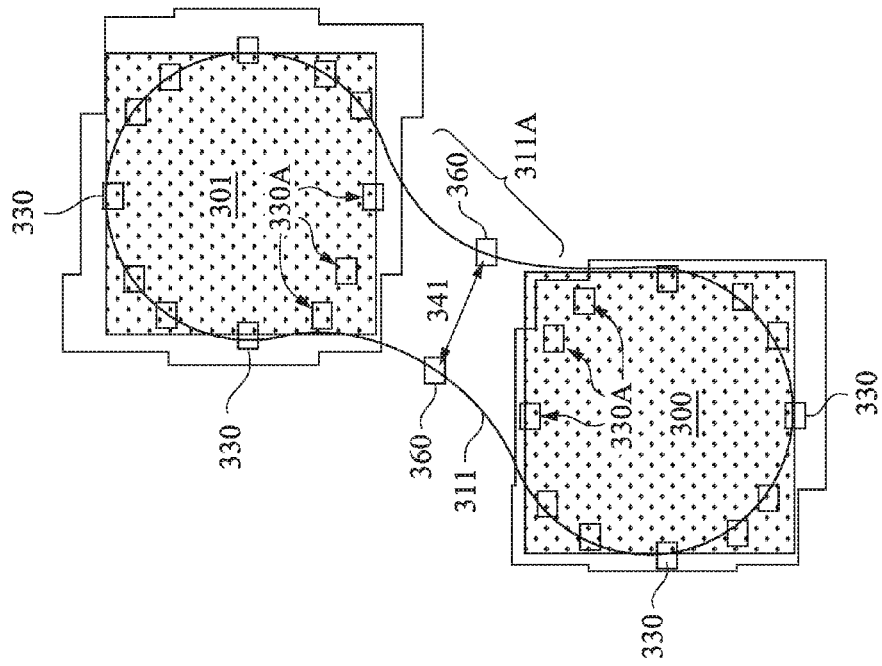
Figure 5A:
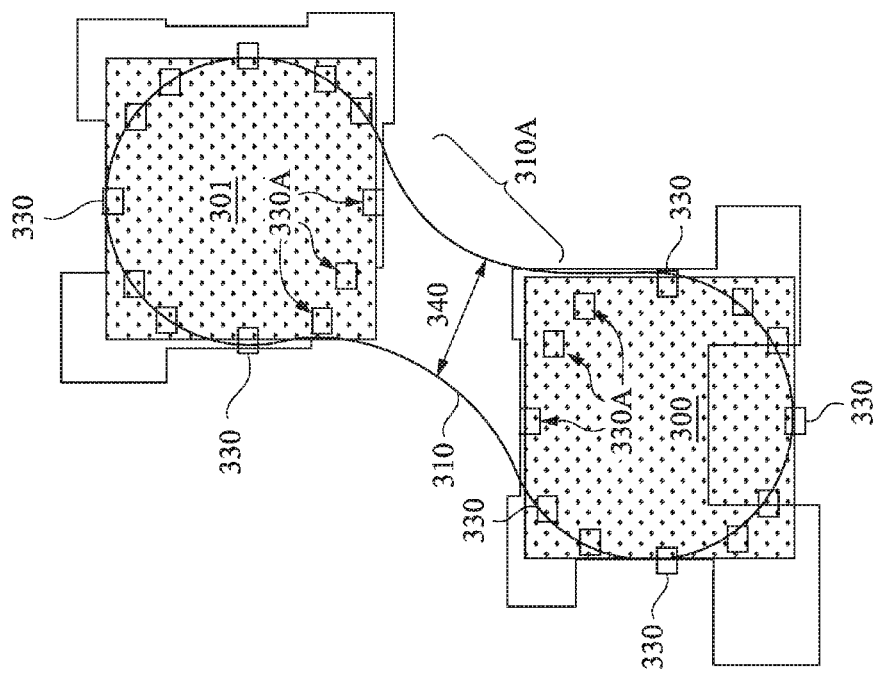

FIGS. 5A and 5B and the discussions below provide yet another example to illustrate the concepts of the present disclosure. In more detail, FIGS. 5A-5B each illustrate a top view of two vias 300 and 301 (as example IC layout patterns) that are nearby each other. However, FIG. 5A also illustrates a simulated contour 310 of the vias 300-301 according to a conventional OPC process, whereas FIG. 5B illustrates a simulated contour 311 of the same vias 300-301 according to an embodiment of the OPC process of the present disclosure. In some embodiments, the vias 300-301 can be difficult to resolve using the double patterning or pitch splitting techniques discussed above.

As is shown in a plurality of target points 330 (not all of which are specifically labeled herein) are implemented to help shape the contour 310. Ideally, the contour 310 should be two separate portions, each portion corresponding to a respective via 300/301. However, due to the close proximity of the vias 300 and 301 (e.g., where the center of the via 300 is less than 90 nm from the center of the via 301 in a 10-nm technology node), they exert a "pull" toward each other, and the resulting contour 310 actually connects the two vias 300-301 together. In other words, a portion 310A of the contour should not exist ideally, but it is nonetheless formed due to the close proximity between the nearby vias 300-301. Since this portion 310A is undesirable it causes bridging between the vias 300-301 it will have to be removed in a later fabrication process, for example by an etching process. Stated differently, the subsequent fabrication process such as etching is supposed to "break up" the contour 310 at the portion 310A to avoid bridging. Thus, the present disclosure is not constrained by conventional OPC rules that do not allow the merging of individual features together.

However, if a lateral dimension 340 at the narrowest part of the portion 310A of the contour is still too thick, the subsequent fabrication process may still not be able to break up the contour 310. Therefore, it would be desirable to ensure that the portion 310A of the contour 310 is sufficiently thin so that it can be broken up by the subsequent fabrication process in order to prevent bridging of the vias 300-301. Unfortunately, despite using many target points to define the shape of the contour 310, the conventional OPC process in FIG. 5A do not take the shape or size of the portion 310A of the contour 310 into account sufficiently, and as such the dimension 340 may be wide enough to cause bridging problems.

Referring now to FIG. 5B, the present disclosure solves this problem by using target points 360 to define the shape and size of a portion 311A of the contour 311. Due to the close proximity between the vias 300-301, the region between them (i.e., the region in which the portion 310A is located) may be viewed as a zone of interaction, similar to the zone of interaction 270 discussed above with reference to FIGS. 3-4. As such, the vias 300-301 are grouped together, and their interactive effects upon each other are considered accordingly.

In the embodiment illustrated, the target points 360 are positioned within this zone of interaction to reduce the negative impact on the resulting contour 311. Specifically, the target points 360 are positioned sufficiently close together to define a lateral dimension 341 of the portion 311A of the contour 311. This is because now the contour 311 would have to go through the target points 360, which helps reshape the contour 311 into having a narrower portion 311A. The dimension 341 is smaller than the dimension 340 (of FIG. 5A). In some embodiments, the dimension 341 is set to be small enough to allow the contour 311 to be "broken up" into two separate portions by a subsequent process such as etching.

It is understood that in various embodiments, the locations of the target points 360 need not be exact. They may be moved up/down/left/right slightly within the zone of interaction, as long as the portion 311A of the resulting contour 311 is narrow enough to be broken up in the subsequent process. In addition, more than two target points 360 may be used in other embodiments, for example in embodiments where the shape of the contour 311 need to be more specifically defined.

As is illustrated in FIG. 5B, some of the previous target points such as the six target points 330A may also be removed according to the present disclosure. The removal of the target points 330A may be due to several reasons. One reason is that they are no longer necessary, since the shape of the relevant portion of the contour 311 is now defined by the newly-added target points 360. Another reason is that the target points 330A, if left un-removed, may actually adversely affect the shape of the contour 311. In any case, the removal of the target points 330A may help speed up OPC simulation, which is beneficial. Furthermore, while it may not be readily noticeable to the naked eye, the locations of the rest of the target points 330 may be moved slightly from FIG. 5A to FIG. 5B as well, in order to generate a more desired contour 311.

While FIGS. 5A and 5B illustrate the interactive effects of two adjacently located vias 300-301 and the subsequent grouping and OPC modification, the concepts of the present disclosure are not limited to only two nearby vias (or any two nearby patterns/polygons). For example, as shown in FIGS. 6A and 6B, the interactive effects between a plurality of (more than two) patterns are illustrated. In FIG. 6A, the top views of three vias 400, 401 and 402 are illustrated. However, each of the vias 400-402 is located sufficiently far away from the rest of the vias 400-402. Therefore, these vias 400-402 need not be grouped together, and no additional OPC modification is necessary (i.e., the original OPC is fine).

FIG. 6B illustrates the top views of five vias 410-414. In some embodiments, the vias 410-414 are difficult to resolve using the double patterning or pitch splitting techniques discussed above. Here, the vias 410-411 are located sufficiently close (e.g., within 90 nm between their respective centers in a 10-nm technology node) to each other that they may affect each other's resulting contour, and the same is true for vias 411-412, vias 412-413, and the vias 413-414. As a result, the vias 410-414 produce a single contour 430 according to OPC simulation, rather than five distinct contours. Again, this contour 430 may be broken up in a later fabrication process as long as the portions 430A between the adjacent vias are not too thick or wide.

According to embodiments of the present disclosure, the vias 410-414 are grouped together in order to properly take into account of the effects each of the vias 410-414 may have on the rest of them. Specifically, target points are placed within the portions 430A between adjacent vias to control the shape of the contour 430, in a manner similar to that discussed above with reference to FIG. 5B. Thus, even for a group of vias, the resulting contour 430 can still be shaped narrow enough in the portions 430A, so that the subsequent fabrication process such as etching can break it up to avoid bridging between any of the vias 410-414.

It is understood that the concepts of the present disclosure are not limited to a particular number of IC layout patterns, or limited to a particular arrangement of the IC layout patterns. For example, the IC layout patterns being grouped together may be more than the two shown in FIGS. 4B and 5B or the five shown in FIG. 6B, and they do not need to all be vias (some of them may be one type of an IC component while others may be another type of an IC component), and they may have any suitable orientation or angle relative to one another.

The discussions above with reference to FIGS. 1-6 have focused on IC layout patterns being grouped together due to close physical proximity. According to some aspects of the present disclosure, IC layout patterns may be grouped together because of pattern density discrepancies (i.e., loading) as well. This is illustrated in FIG. 7, which shows diagrammatic top views of a plurality of IC layout patterns 500-505. The IC layout patterns 500-505 have rectangular shapes herein and may correspond to gate lines, metal lines, contact pads, or other suitable IC components.

IC layout patterns 500-505 are substantially equidistant from one another (in a vertical direction shown in FIG. 7), and IC layout patterns 501-505 may have substantially similar sizes. However, the IC layout pattern 500 is substantially greater in size than the IC layout patterns 501-505. In some embodiments, the IC layout pattern 500 is at least five times greater in size than each of the IC layout patterns 501-505. In other embodiments, the IC layout pattern 500 is at least ten times greater in size than each of the IC layout patterns 501-505.

Because of its much greater size (i.e., heavier loading), the IC layout pattern 500 exerts a significant influence on its nearest IC layout pattern 501, even though the distance separating them is not necessarily that small. In other words, had the IC layout pattern 500 been a comparable size to the IC layout pattern 501, the IC layout pattern 500 may not have such a significant impact on the contour of the IC layout pattern 501 to warrant the tweaking of conventional OPC settings/schemes. The influence exerted by the IC layout pattern 500 weakens as it propagates downward vertically, which means it may affect the IC layout pattern 502 slightly, but its impact on the IC layout patterns 503-505 may be negligible.

As such, the conventional or "regular" OPC settings/schemes may be used for the IC layout patterns 503-505, since they are not affected very much by the "big" IC layout pattern 500, and they are not too close to each other to affect each other's contour generation. For the IC layout pattern 502, since it is closer to the "big" IC layout pattern 500, its OPC settings may or may not be tweaked a little to account for the impact, which may depend on a number of other factors (such as criticality of the pattern 502, or the exact distance separating it from its adjacent patterns, etc.). For the "big" pattern 500, special OPC settings or schemes may need to be implemented due to its substantially greater size.

The patterns 500-501 need to be grouped together to compensate for the impact the "big" pattern 500 has on the relatively small pattern 501. In various embodiments, the dissection locations and target points for the IC layout pattern 501 and the portion of the "big" layout pattern 500 nearby need to be adjusted. For example, the top edge of the IC layout pattern 501 may be dissected into smaller segments, and additional target points may be placed thereon in order to better define the resulting contour of the pattern 501. Otherwise, the size or loading discrepancy between the IC layout patterns 500-501 may distort the contour of the IC layout pattern 501 to the point that it may no longer satisfy the design rules, or bridging between the patterns 500-501 may occur. The dissection locations and target points are not specifically illustrated herein for reasons of simplicity.

Figure 8:
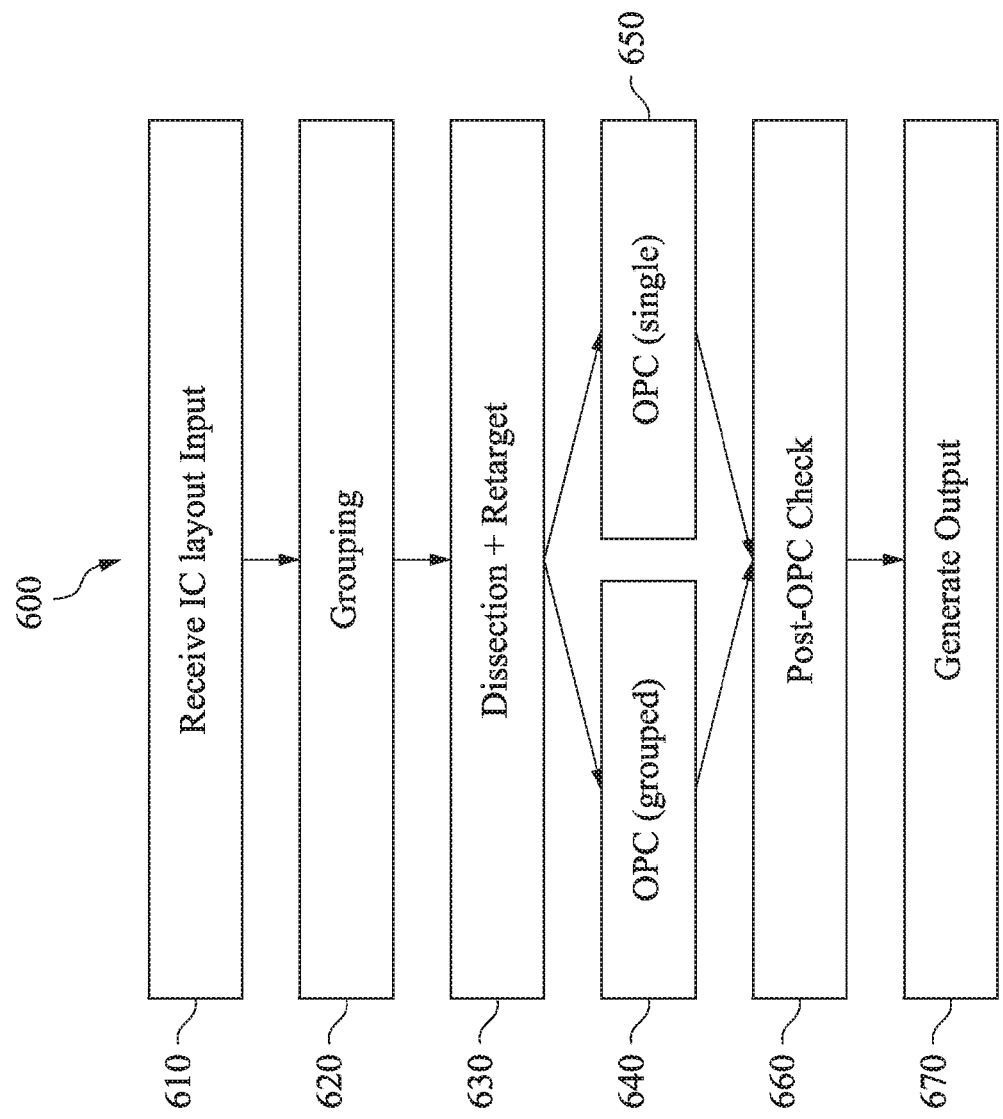
FIGS. 8-9 are flowcharts of methods of performing OPC in accordance with some embodiments of the present disclosure.

FIG. 8 is a flowchart of a method 600 illustrating the OPC process flow according to an embodiment of the present disclosure. The method 600 begins with a step 610 of receiving an IC design layout (or IC design pattern) from a designer as an input. In one example, the designer can be a design house. In another example, the designer is a design team separated from a semiconductor manufacturer assigned for making IC products according to the IC design layout. In various embodiments, the semiconductor manufacturer is capable for making photomasks, semiconductor wafers, or both. The IC design layout includes various geometrical patterns designed for an IC product and based on the specification of the IC product.

The IC design layout is presented in one or more data files having the information of the geometrical patterns. In one example, the IC design layout is expressed in a "GDS" format known in the art. The designer, based on the specification of the product to be manufactured, implements a proper design procedure to carry out the IC design layout. The design procedure may include logic design, physical design, and/or place and route. As an example, a portion of the IC design layout includes various IC features (also referred to as main features), such as active region, gate electrode, source and drain, metal lines or via of the interlayer interconnection, and openings for bonding pads, to be formed in a semiconductor substrate (such as a silicon wafer) and various material layers disposed over the semiconductor substrate. The IC design layout may include certain assist features, such as those features for imaging effect, processing enhancement, and/or mask identification information.

The method 600 proceeds to a step 620 in which at least a subset of the IC patterns/features are grouped together. The grouping may be performed based on the physical proximity between the features that are candidates to be grouped, or it may be based on other factors such as loading or pattern density discrepancies. For the IC patterns or features that are grouped together, the environmental impacts contributed by one of them needs to be considered for the other pattern/feature, and vice versa.

The method 600 proceeds to a step 630 in which the dissections and/or target points are adjusted for the grouped IC patterns/features. In some embodiments, a zone of interaction may be defined for the grouped IC patterns/features, and the dissection locations or target points may be changed within the zone to shape the simulated contour. In some embodiments, additional auxiliary target points may be added to generate a better defined contour.

The method 600 proceeds to a step 640 to run an OPC process for the grouped IC patterns/features or a step 650 to run an OPC process for a single IC pattern/feature. The OPC is performed to correct the image errors by modifying the IC design layout. In some embodiments, the OPC process includes a model-based OPC simulation. After each OPC simulation is executed, the method 600 may repeat the dissection and retargeting step 630, and afterwards the OPC simulation is performed again. This iterative process may continue until the modified IC design layout is capable of producing an acceptable image from the respective photomask to a wafer.

The method 600 continues with a step 660 to run a post-OPC check. At this step, the IC design layout is checked by one or more mask rules and is modified accordingly. In one embodiment, various mask rules are extracted from the mask fabrication. Various mask making data are collected from the mask fabrication and extracted into a set of rules that the IC design layout, as the pattern to be imaged to a mask, should follow.

The method 600 continues with a step 670 to generate an output. In some embodiments, the output includes a modified IC design layout file in a format accessible by a mask making tool, such as an e-beam mask writer. In one embodiment, the modified IC design layout file is expressed in a GDS format. The modified IC design layout includes various OPC modifications from the steps discussed above. In some embodiments, the output may include the fabrication of a mask or a group of masks based on the modified IC design layout. In one embodiment, an e-beam or a mechanism of multiple e-beams is used to form a pattern on a mask (photomask or reticle) based on the IC design layout. The mask can be formed in various suitable technologies. In one embodiment, the mask is formed using the binary technology. In this case, the mask pattern includes opaque regions and transparent regions. The radiation beam (e.g. ultraviolet or UV beam), used to expose the image sensitive material layer (such as photoresist) coated on a wafer, is blocked by the opaque region and transmits through the transparent regions. In one example, the binary mask includes a transparent substrate (e.g., fused quartz), and an opaque material (e.g., chromium) coated in the opaque regions of the mask. In another embodiment, the mask is formed using a phase shift technology. In the phase shift mask (PSM), various features in the pattern formed on the mask are configured to have proper phase difference to enhance the resolution and imaging quality. In various examples, the PSM can be an attenuated PSM or an alternating PSM known in the art.

Other processing steps may follow after the formation of the mask. As an example, a semiconductor wafer is fabricated using a mask or a set of masks formed by the above method. The semiconductor wafer includes a silicon substrate or other proper substrate and material layers formed thereon. Other proper substrate may alternatively be made of some suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The semiconductor wafer may further include various doped regions, dielectric features, and multilevel interconnects (or are formed at subsequent manufacturing steps). In one example, the mask is used in an ion implantation process to form various doped regions in the semiconductor wafer.

In another example, the mask is used in an etching process to form various etching regions in the semiconductor wafer. In another example, the mask is used in a deposition process, such as chemical vapor deposition (CVD) or physical vapor deposition (PVD), to form a thin film in various regions on the semiconductor wafer. Various manufacturing data may be collected from various manufacturing processes including CVD, PVD, etching, ion implantation and a lithography process from the previously processed semiconductor wafers, processing tools, and metrology tools.

Figure 9:
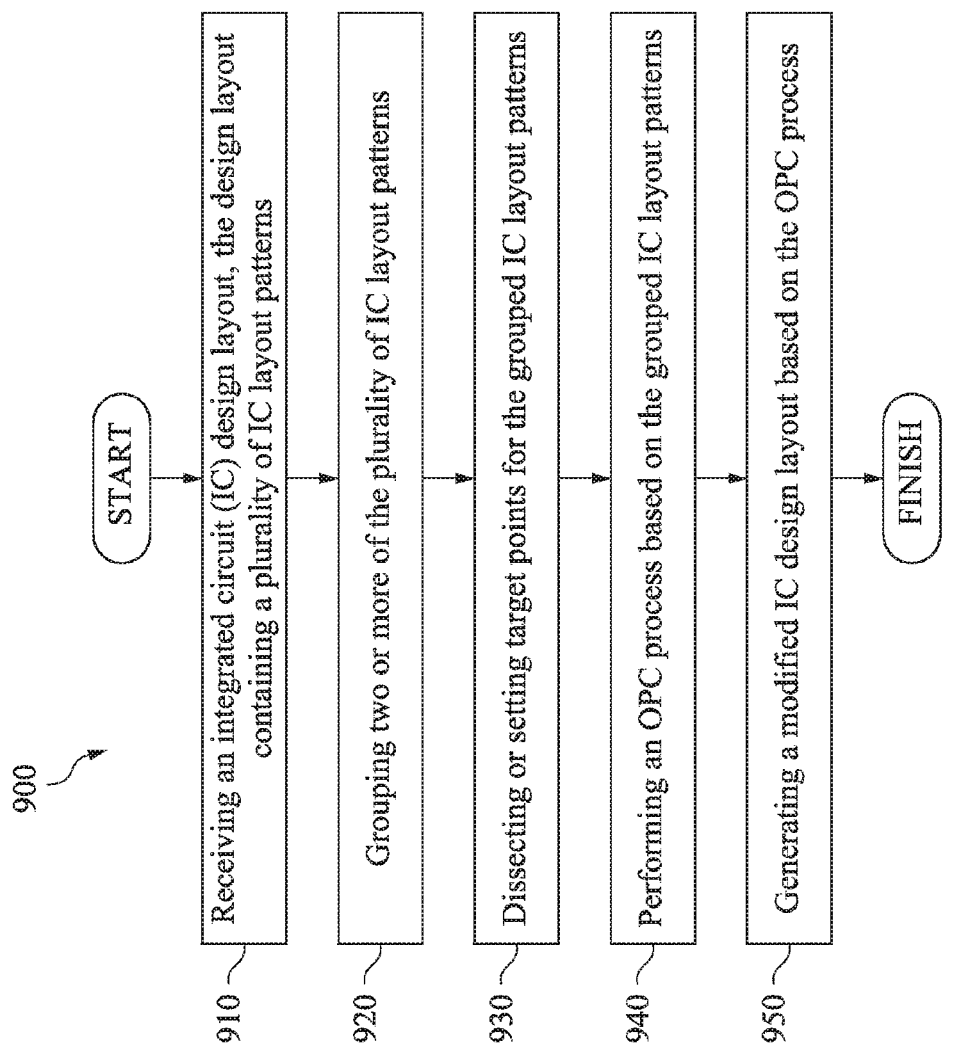

FIG. 9 is a flowchart illustrating a method 800 of performing an OPC process. The method includes a step 910 of receiving an integrated circuit (IC) design layout. The design layout contains a plurality of IC layout patterns. The IC layout patterns may manifest themselves as polygons.

The method includes a step 920 of grouping two or more of the plurality of IC layout patterns. In some embodiments, the IC layout patterns that are nearby one another are grouped together, or the IC layout patterns that have substantially different loading are grouped together.

The method includes a step 930 of dissecting or setting target points for the grouped IC layout patterns. In some embodiments, the dissecting or the setting target points comprises dissecting or setting target points asymmetrically for each of the IC layout patterns in the grouped IC layout patterns.

The method includes a step 940 of performing an OPC process based on the grouped IC layout patterns. In some embodiments, the OPC process comprises performing an OPC simulation.

The method includes a step 950 of generating a modified IC design layout based on the OPC process.

In some embodiments, IC layout patterns that are nearby one another are identified. These IC layout patterns are grouped together. In some embodiments, a zone of interaction is identified between the patterns that are nearby one another. The dissecting or the setting target points may be performed within the zone of interaction. In some embodiments, the dissection locations or target points are moved within the zone of interaction. In some embodiments, one or more auxiliary target points are added within the zone of interaction.

It is understood that additional processes may be performed before, during, or after the steps 910-950. For example, the method 900 may include a step of running a post-OPC check after the OPC simulation has been performed. Other processes are not specifically discussed herein for reasons of simplicity.

Based on the above discussions, it can be seen that the present disclosure offers various advantages over convention OPC processes. It is understood, however, that not all advantages are necessarily discussed herein, and other embodiments may offer different advantages, and that no particular advantage is required for all embodiments. One advantage is that the OPC processes of the present disclosure take into account of the environmental surroundings of IC layout patterns. This is because the IC layout patterns' contours are affected by factors such as the physical proximity of neighboring patterns/features, or loading (e.g., whether there is a significantly bigger IC pattern nearby). A zone of interaction is defined by the patterns that are likely to affect one another's contour generation. These patterns are grouped together, and dissection locations and/or target points are adjusted within near the zone of interaction so as to minimize the undesirable effects of the interaction on the contour generation. Consequently, the actually fabricated patterns are less likely to suffer from issues such as bridging and may better resemble their original designs. Another advantage is that the OPC processes discussed herein are compatible with existing process flow, which makes them easy to implement.

The present disclosure provides for a method of performing optical proximity correction (OPC). An integrated circuit (IC) design layout is received. The design layout contains a plurality of IC layout patterns. Two or more of the plurality of IC layout patterns are grouped together. The grouped IC layout patterns are dissected, or target points are set for the grouped IC layout patterns. Thereafter, an OPC process is performed based on the grouped IC layout patterns.

The present disclosure provides a method of performing optical proximity correction (OPC). An integrated circuit (IC) design layout is received. The design layout contains a plurality of IC features. A subset of IC features is identified. The subset of IC features are located within a predetermined distance from one, or they have substantially different loading. The subset of the IC features are grouped. Dissection locations or target points are specified for the grouped IC layout patterns. Simulated contours are generated for the grouped subset of the IC features.

The present disclosure provides for a method of performing optical proximity correction (OPC). An integrated circuit (IC) design layout is received. The design layout contains a plurality of polygons. A zone of interaction is determined for at least a subset of the polygons. The determining comprises identifying polygons that are in close physical proximity or polygons that have substantially different geometric sizes. For the subset of the polygons, their edges are dissected, or target point locations are set. The dissecting or the setting of the target point locations within the zone of interaction are performed differently than the dissecting or the setting of the target point locations outside the zone of interaction. Thereafter, an OPC simulation is performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving an integrated circuit (IC) design layout, the design layout containing a plurality of IC layout patterns that include a first IC layout pattern and a second IC layout pattern;
   determining that the first IC layout pattern exerts an optical imaging influence on the second IC layout pattern;
   compensating for the optical imaging influence at least in part by:
      manipulating a dissection location of the first IC layout pattern or the second IC layout pattern by moving the dissection location of the first IC layout pattern closer to the second IC layout pattern or by moving the dissection location of the second IC layout pattern closer to the first IC layout pattern; or
      manipulating a target point for the first IC layout pattern or the second IC layout pattern by moving the target point of the first IC layout pattern closer to the second IC layout pattern or by moving the dissection location of the second IC layout pattern closer to the first IC layout pattern;

generating a modified IC design layout based on the compensating; and facilitating a fabrication of a mask using the modified IC design layout.

2. The method of claim 1, further comprising: performing an optical proximity correction (OPC) process after the compensating.

3. The method of claim 2, wherein the performing of the OPC process comprises performing a model-based OPC simulation.

4. The method of claim 1, wherein the determining comprises determining that a distance between the first IC layout pattern and the second IC layout pattern is less than a predetermined threshold distance.

5. The method of claim 1, wherein the determining comprises determining that the first IC layout pattern has a greater size than the second IC layout pattern.

6. The method of claim 1, wherein the manipulating comprises moving the dissection location of the first IC layout pattern or the second IC layout pattern.

7. The method of claim 6, further comprising: identifying a zone between the first IC layout pattern and the second IC layout pattern, wherein the moving the dissection location comprises moving the dissection location toward a center of the zone.

8. The method of claim 1, wherein the manipulating comprises moving the target point for the first IC layout pattern or the second IC layout pattern.

9. The method of claim 8, further comprising: identifying a zone between the first IC layout pattern and the second IC layout pattern, wherein the moving the target point comprises moving the target point toward a center of the zone.

10. The method of claim 1, wherein the manipulating comprises adding an extra target point for the first IC layout pattern or the second IC layout pattern.

11. A method, comprising:
receiving an integrated circuit (IC) design layout, the design layout containing a plurality of IC layout patterns that include a first IC layout pattern and a second IC layout pattern;
determining, based on a distance or a size difference between the first and second IC layout patterns, that the first IC layout pattern exerts an undesirable optical imaging influence on the second IC layout pattern, or vice versa;
compensating for the undesirable optical imaging influence at least in part by identifying a zone between the first IC layout pattern and the second IC layout pattern and moving a dissection location or a target point of at least one of the first and second IC layout patterns toward a center of the zone;
generating a modified IC design layout based on the compensating; and
facilitating a fabrication of a lithography mask based on the modified IC design layout.

12. The method of claim 11, further comprising:
performing an optical proximity correction (OPC) simulation after the compensating, wherein the modified IC design layout is generated based on the OPC simulation.

13. The method of claim 12, further comprising: fabricating the lithography mask based on the modified IC design layout.

14. The method of claim 11, wherein the determining comprises:
determining that a distance separating the first and second IC layout patterns is smaller than a predetermined distance; or
determining that the size difference between the first and second IC layout patterns causes a loading effect for at least one of the first and second IC layout patterns.

15. The method of claim 11, wherein the compensating further comprises adding one or more auxiliary target points for at least one of the first and second IC layout patterns.

16. A method, comprising:
receiving an integrated circuit (IC) design layout, the design layout containing a plurality of IC layout patterns that include a first IC layout pattern and a second IC layout pattern;
determining that a distance between the first and second IC layout patterns is less than a predefined limit or that a size difference between the first and second IC layout patterns exceeds a predefined limit;
identifying a zone between the first and second IC layout patterns in which an undesirable optical imaging influence is exerted due to the distance or the size difference between the first and second IC layout patterns;
performing one or more of the following processes to compensate for the undesirable optical imaging influence:
moving one or more dissection locations inside the zone toward a center of the zone; or
moving one or more target points inside the zone toward the center of the zone;
generating a modified IC design layout after the undesirable optical imaging influence is compensated; and
facilitating a fabrication of a lithography mask based on the modified IC design layout.

17. The method of claim 16, further comprising:
fabricating the lithography mask based on the modified IC design layout.

18. The method of claim 16, further comprising adding one or more auxiliary points inside the zone to compensate for the undesirable optical imaging influence.

19. The method of claim 16, further comprising performing an optical proximity correction (OPC) process based on the moving of the one or more dissection locations or the moving of the one or more target points.

20. The method of claim 16, wherein:
the moving of the one or more dissection locations is performed without moving any dissection location outside the zone; and
the moving of the one or more target points is performed without moving any target points outside the zone.

* * * * *